(12) United States Patent
Tiemeijer

(10) Patent No.: US 7,026,829 B2
(45) Date of Patent: Apr. 11, 2006

(54) METHOD FOR CALIBRATING AND DE-EMBEDDING, SET OF DEVICES FOR DE-EMBEDDING AND VECTOR NETWORK ANALYZER

(75) Inventor: Lukas Frederik Tiemeijer, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/514,327

(22) PCT Filed: May 8, 2003

(86) PCT No.: PCT/IB03/01932

§ 371 (c)(1),
(2), (4) Date: Nov. 13, 2004

(87) PCT Pub. No.: WO03/098255

PCT Pub. Date: Nov. 27, 2003

(65) Prior Publication Data

US 2005/0179444 A1    Aug. 18, 2005

(30) Foreign Application Priority Data

May 16, 2002 (EP) .................................. 02076911

(51) Int. Cl.
*G01R 27/04* (2006.01)
*G01R 35/00* (2006.01)
*G01D 18/00* (2006.01)

(52) U.S. Cl. ................. 324/638; 324/601; 702/85

(58) Field of Classification Search ................ 324/637, 324/638, 629, 650, 601, 600, 74, 76.11, 130, 324/76.19, 202, 76.22, 158.1, 649; 702/57, 702/65, 85, 90, 104, 107, 108, 117, 118, 182, 702/189
See application file for complete search history.

(56) References Cited

U.S. PATENT DOCUMENTS

| | | | |
|---|---|---|---|
| 6,249,128 B1 * | 6/2001 | Begg | 324/601 |
| 6,643,597 B1 * | 11/2003 | Dunsmore | 702/104 |
| 6,744,262 B1 * | 6/2004 | Adamian | 324/638 |
| 6,832,170 B1 * | 12/2004 | Martens | 702/65 |
| 6,895,343 B1 * | 5/2005 | Jacobsen et al. | 702/57 |
| 2004/0051538 A1 * | 3/2004 | Adamian | 324/601 |
| 2004/0201383 A1 * | 10/2004 | Anderson | 324/600 |

* cited by examiner

*Primary Examiner*—Anjan Deb
*Assistant Examiner*—Hoai-An D. Nguyen
(74) *Attorney, Agent, or Firm*—Peter Zawilski

(57) ABSTRACT

The accuracy of a method for calibrating an N terminal microwave measurement network (10), the method comprising the measurement of network parameter values of a load device (43), depends on the knowledge of the parasitic impedance of the load device (43). According to the invention, the accuracy of the method is improved by at least approximately determining the parasitic impedances of the load device (43). In one embodiment this is achieved by measuring network parameter values of an auxiliary open device (44), having a substantially identical parasitic impedance as the load device (43). The accuracy is further increased by measuring network parameter values of an auxiliary short device (45), having a substantially identical parasitic impedance as the load device (43). A similar principle can be used for de-embedding a device under test. A load device (43), an auxiliary open device (44) and an auxiliary short device (45) having substantially identical parasitic impedances are disclosed.

14 Claims, 7 Drawing Sheets

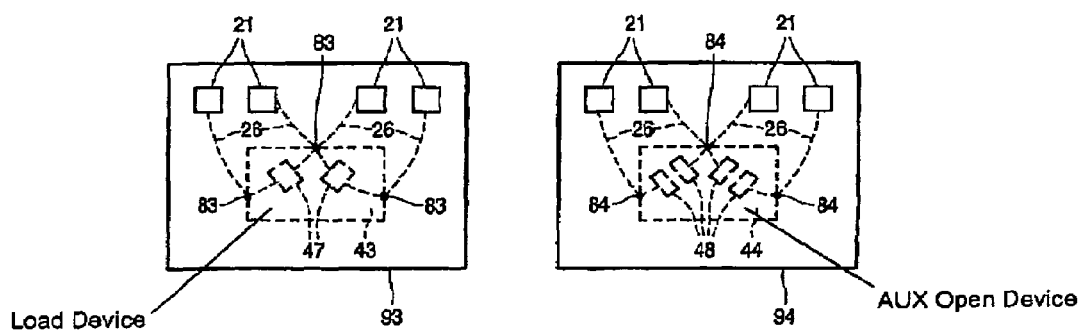
Load Device　　　　　FIG. 2C　　　　　　FIG. 2D　　　AUX Open Device
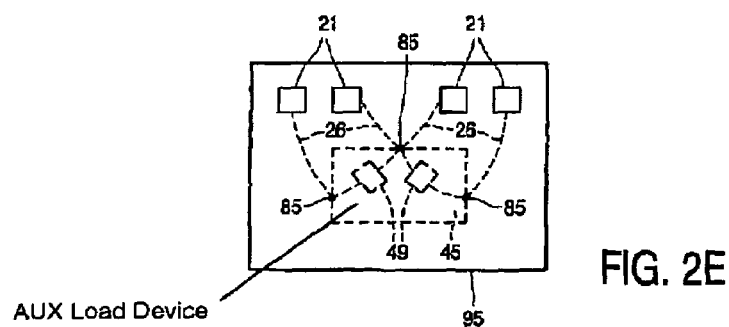
AUX Load Device　　　　FIG. 2E

METHOD FOR CALIBRATING AND DE-EMBEDDING, SET OF DEVICES FOR DE-EMBEDDING AND VECTOR NETWORK ANALYZER

CROSS-REFERENCE TO RELATED APPLICATION

This application is a 371 National Phase of the International Application No. PCT/IB03/01932 filed May 8, 2003, claiming priority to a Foreign Application: EUROPEAN PATENT OFFICE (EPO) No. 02076911.3, filed May 16, 2002.

BACKGROUND OF THE INVENTION

1. Field of the Invention

The invention relates to a method for calibrating a microwave measurement network having N terminals, N being an integer larger than one, the method comprising the steps of measuring open network parameter values of an open device having N terminals, which are mutually electrically insulated, measuring short network parameter values of a short device having N terminals, which are mutually electrically connected by conductors, each conductor having a short device DC resistance, measuring load network parameter values of a load device having N terminals, which are mutually electrically connected by resistors, each resistor having a load device DC resistance, which is larger than the short device DC resistance, the load device having a parasitic load impedance.

The invention also relates to a method for de-embedding a device under test having N terminals.

The invention also relates to a set of devices for de-embedding a device under test having N terminals.

The invention also relates to a vector network analyzer arranged for executing the method for de-embedding according to the invention.

2. Description of the Prior Art

U.S. Pat. No. 4,858,160 discloses an embodiment of a method for calibrating an N terminal microwave measurement network. The aim of this method is to calibrate an N terminal microwave measurement network such that the microwave characteristics of a device under test (DUT), which may be embedded in a semiconductor article of manufacture, can be determined by means of a vector network analyzer (VNA). The accurate knowledge of microwave characteristics of DUTs such as transistors and inductors is necessary when designing and manufacturing an apparats applying microwave radiation such as, e.g., a mobile telephone.

A VNA comprises at least an input probe and an output probe, each probe having at least one signal lead. In many cases the probes also have a ground lead. The probes are brought into contact with bond pads, which are at the surface of the body comprising the DUT and which are electrically connected to the terminals of the DUT. The body comprising the DUT may be a semiconductor article of manufacture.

The VNA generates a microwave test signal, which is directed to the input probe. It measures the amplitude and phase of the signal reflected back into the input probe and the amplitude and phase of the signal transmitted to the output probe as function of, e.g., the frequency of the microwave test signal. The transmitted and the reflected signal are used to first determine the DUT network parameter values of the DUT, which are then used to determine the microwave characteristics of the DUT.

In general, the measurement of the microwave characteristics of the DUT is prone to artifacts due to parasitic impedances of various sources, including:
the VNA;
cables connecting the VNA and the probes;
the probes themselves;
the probes contacting the bond pads;
the bond pads themselves;
interconnects connecting the bond pads and the DUT.

In order to obtain the microwave characteristics of the DUT with a high precision, it is essential to remove the contributions of the parasitic impedances from the measurements. This is often done in two steps. In a first step the VNA is calibrated using a set of devices, which often comprises:
an open device, in which a bond pad to be contacted with an input lead is electrically insulated from a bond pad to be contacted with an output lead;
a short device, in which a bond pad to be contacted with an input lead is electrically connected to a bond pad to be contacted with an output lead in such a way that the DC resistance between the two bond pads is low, e.g., below 5 Ohm; and
a load device, in which a bond pad to be contacted with an input lead is electrically connected to a bond pad to be contacted with an output lead in such a way that the DC resistance between the two bond pads has a predetermined value of, e.g., 50 Ohm.

As a result of this calibration, ideally all parasitic impedances between the VNA and the probe tips, not including the bond pads and the interconnects, are determined and subsequently removed.

In a second step, which is often called de-embedding, it is aimed to remove the parasitic impedances of the bond pads and the interconnects from the measured network parameter values of the DUT. These parasitic impedances are determined using another set of devices. All of the devices of this set are integrated in a semiconductor article of manufacture in a way similar to the DUT. Preferably, they all have bond pads and interconnects substantially identical to the corresponding parts of the DUT. This set of devices comprises:
the DUT;
an open device, in which a bond pad to be contacted with an input lead is electrically insulated from a bond pad to be contacted with an output lead;
a short device, in which a bond pad to be contacted with an input lead is electrically connected to a bond pad to be contacted with an output lead in such a way that the DC resistance between the two bond pads is low, e.g., below 5 Ohm; and
a load device, in which a bond pad to be contacted with an input lead is electrically connected to a bond pad to be contacted with an output lead in such a way that the DC resistance between the two bond pads has a designed value of, e.g., 50 Ohm.

After performing the calibration step, the reference plane of the microwave characterization is located at the bond pads. After performing the de-embedding step, the reference plane is located at the terminals of the DUT and the microwave characteristics of the DUT are obtained.

The accuracy of both the calibration step and the de-embedding step and, as a consequence, the accuracy of the determined microwave characteristics of the DUT depend critically on the exact knowledge of the impedances of the open device, the short device and the load device used for calibration and de-embedding.

It is a drawback of the known method for calibrating and de-embedding that the microwave characteristics of the DUT are determined not precisely enough, in particular at relatively high frequencies of, e.g., 10 GHz or higher.

SUMMARY OF THE INVENTION

It is an object of the invention to provide a method for calibrating an N terminal microwave measurement network of the kind described in the opening paragraph, which allows for determination of the microwave characteristics of a DUT with a relatively high accuracy.

The invention is defined by the independent claims. The dependent claims define advantageous embodiments.

The invention is based on the insight that the accuracy of the known method is limited mainly by the unknown parasitic load impedance. The microwave characteristics of a DUT are determined with an improved accuracy when the parasitic load impedance of the load device used for the calibration step is at least approximately known.

In one embodiment of the method according to the invention, the step of at least approximately determining the parasitic load impedance comprises the sub-step of measuring auxiliary open network parameter values of an auxiliary open device having N terminals being mutually electrically insulated, the auxiliary open device having a parasitic auxiliary open impedance, which is substantially identical to the parasitic load impedance.

By measuring network parameter values of an auxiliary open device, which has a parasitic impedance substantially identical to the parasitic load impedance, additional information on the parasitic load impedance of the load device used for the calibration method is obtained. This additional information on the parasitic load impedance is then used to at least approximately determine the parasitic load impedance.

It is advantageous if the step of at least approximately determining the parasitic load impedance further comprises the sub-step of measuring auxiliary short network parameter values $Y_{M,AS}$ of an auxiliary short device (45) having N terminals (85), which are mutually electrically connected by conductors (49), each conductor (49) having an auxiliary short device DC resistance, which is smaller than the load device DC resistance, the auxiliary short device (45) having a parasitic auxiliary short impedance, which is substantially identical to the parasitic load impedance.

The microwave characteristics of a DUT is determined with an even better accuracy when the parasitic load impedance is even better known as compared to the above approximation. By measuring network parameter values of an auxiliary open device and an auxiliary short device, which both have a parasitic impedance substantially identical to the parasitic load impedance, even more additional information on the parasitic load impedance is obtained. This additional information on the parasitic load impedance is then used to determine the parasitic load impedance with an improved accuracy.

The two measurements of the network parameter values of the auxiliary open device and the auxiliary short device comprise substantially complementary information when the auxiliary short device DC resistance is substantially smaller than the load device DC resistance. Preferably the auxiliary short device DC resistance is zero or at least as small as possible. Preferably the load device DC resistance has a well-defined value. Preferably the load device DC resistance is chosen such that it matches the impedance of the signal leads of the VNA. For many VNA's the load device DC resistance should be similar to 50 Ohm.

The method for de-embedding a device under test according to the invention is characterized by the step of at least approximately determining the parasitic load impedance prior to determining the device specific microwave characteristics $Y_{DUT}$. The microwave characteristics of the DUT are determined with an improved accuracy when the parasitic load impedance of the load device used for the de-embedding step is at least approximately known.

In an embodiment of the method for de-embedding a device under test the step of at least approximately determining the parasitic load impedance comprises the sub-step of measuring auxiliary open network parameter values of an auxiliary open device having N terminals and being embedded in a semiconductor article of manufacture by an embedding structure, which is substantially identical to the DUT embedding structure, the N terminals of the auxiliary open device being mutually electrically insulated, the auxiliary open device having a parasitic auxiliary open impedance, which is substantially identical to the parasitic load impedance.

By measuring network parameter values of an auxiliary open device, which has a parasitic impedance substantially identical to the parasitic load impedance, additional information on this parasitic load impedance is obtained. This additional information on the parasitic load impedance is then used to at least approximately determine this parasitic load impedance.

It is advantageous if the measured load network parameter values are modeled by a load network comprising a first impedance set being independent from the load device, the measured auxiliary open network parameter values are modeled by an auxiliary open network comprising the first impedance set, the measured short network parameter values are modeled by an auxiliary short network comprising the first impedance set, the first impedance set is determined from the modeled load network, the modeled auxiliary open network, and the modeled auxiliary short network, the measured open network parameter values are modeled by an open network comprising the first impedance set and a second impedance set, the measured short network parameter values are modeled by a short network comprising the first impedance set and the second impedance set, the second impedance set is determined from the modeled open network, the modeled short network, and the determined first impedance set, the measured DUT network parameter values are modeled by a DUT network comprising the first impedance set, the second impedance set and a DUT impedance set, and the DUT impedance set is determined from the modeled DUT network, the determined first impedance set, and the determined second impedance set.

Following these steps the parasitic load impedance is approximately determined. This approximation, involving a short device not having the parasitic load impedance, but being treated as if it had the parasitic load impedance, neglects the inductive part of the parasitic load impedance and accounts only for the capacitive part. The approximation is therefore particularly useful when the inductive part of the parasitic load is relatively small.

When the measured load network parameter values, the measured auxiliary open network parameter values and the measured short network parameter values are modeled by a network comprising a first impedance set which is independent of the load device, it is possible to approximately determine this first impedance set from these network parameter values. The result for the first impedance set is then reused for determining the parasitic impedances due to the DUT embedding structure from the measured open network parameter values and the measured short network parameter values.

It is advantageous if the step of at least approximately determining the parasitic load impedance further comprises the sub-step of measuring auxiliary short network parameter values of an auxiliary short device, the auxiliary short device comprising N terminals and being embedded in a semiconductor article of manufacture by an embedding structure, which is substantially identical to the DUT embedding structure, the N terminals of the auxiliary short device being mutually electrically connected, each connection having an auxiliary short device DC resistance, which is smaller than the load device DC resistance, the auxiliary short device having a parasitic auxiliary short impedance, which is substantially identical to the parasitic load impedance.

The two measurements of the network parameter values of an auxiliary open device and an auxiliary short device comprise substantially complementary information when the auxiliary short device DC resistance is substantially smaller than the load device DC resistance. Preferably the auxiliary short device DC resistance is zero or at least as small as possible. Preferably the load device DC resistance has a well-defined value. Preferably the load device DC resistance is similar to the impedance of the signal leads of the VNA. For many VNA's a load device DC resistance of close to 50 Ohm will be preferred.

The microwave characteristics of the DUT is determined with an even better accuracy when the parasitic load impedance of the load device used for de-embedding is even better known as compared to the above approximation. By measuring network parameter values of an auxiliary open device and an auxiliary short device, which both have an embedding structure substantially identical to the DUT embedding structure and which both have a parasitic impedance substantially identical to the parasitic load impedance, even more additional information on the parasitic load impedance is obtained. This additional information on the parasitic load impedance is then used to determine the parasitic load impedance with an improved accuracy.

It is advantageous if the measured load network parameter values are modeled by a load network comprising a first impedance set being independent from the load device, the measured auxiliary open network parameter values are modeled by an auxiliary open network comprising the first impedance set, the measured auxiliary short network parameter values are modeled by an auxiliary short network comprising the first impedance set, the first impedance set is determined from the modeled load network, the modeled auxiliary open network, and the modeled auxiliary short network, the measured open network parameter values are modeled by an open network comprising the first impedance set and a second impedance set, the measured short network parameter values are modeled by a short network comprising the first impedance set and the second impedance set, the second impedance set is determined from the modeled open network, the modeled short network, and the determined first impedance set, the measured DUT network parameter values are modeled by a DUT network comprising the first impedance set, the second impedance set and a DUT impedance set, and the DUT impedance set is determined from the modeled DUT network, the determined first impedance set, and the determined second impedance set.

These steps, which are very similar to the steps discussed above, allow for determination of the parasitic load impedance with an increased accuracy. Here, the above-mentioned approximation is not evoked and measured auxiliary short network parameter values are used which are obtained from an auxiliary short device having the parasitic load impedance. Therefore, the inductive part of the parasitic load impedance is no longer neglected and both the inductive and the capacitive part of the parasitic load impedance are taken into account.

When the measured load network parameter values, the measured auxiliary open network parameter values and the measured auxiliary short network parameter values are modeled by a network comprising a first impedance set which is independent of the load device, it is possible to determine this first impedance set from these network parameter values with an improved accuracy. The result for the first impedance set is then reused for determining the parasitic impedances due to the DUT embedding structure from the measured open network parameter values and the measured short network parameter values. It is now counteracted that the parasitic impedances due to the DUT embedding structure mix with the parasitic load impedance, yielding an improved accuracy of the de-embedding.

A set of devices according to the invention is characterized by an auxiliary open device having N terminals and being embedded in a semiconductor article of manufacture by an embedding structure, which is substantially identical to the DUT embedding structure, the N terminals of the auxiliary open device being mutually electrically insulated, the auxiliary open device having a parasitic auxiliary open impedance, which is substantially identical to the parasitic load impedance.

A set of devices for microwave characterization of a device under test, which comprises an auxiliary open device having an embedding structure substantially identical to the embedding structure of the DUT and a parasitic auxiliary open impedance substantially identical to the parasitic load impedance, is used to at least approximately determine the parasitic toad impedance and thereby increasing the accuracy of the microwave characterization of the DUT.

It is advantageous if the set further comprising an auxiliary short device having N terminals and being embedded in a semiconductor article of manufacture by an embedding structure, which is substantially identical to the DUT embedding structure, the N terminals of the auxiliary short device being mutually electrically connected, each connection having an auxiliary short device DC resistance, which is smaller than the load device DC resistance, the auxiliary short device having a parasitic auxiliary short impedance, which is substantially identical to the parasitic load impedance.

Such a set of devices is used to determine the parasitic load impedance with an improved accuracy and thereby increasing the accuracy of the microwave characterization of the DUT.

It is advantageous if the load device comprises a load device structure, the auxiliary open device comprises an auxiliary open device structure, which is substantially identical to the load device structure, the load device structure comprising a first body having a first surface area, a first lead electrically connecting a first terminal and the first body, a second body, a second lead electrically connecting a second terminal and the second body, the load device further comprises a third body having a third surface area and electrically connecting the first body and the second body.

By using a load device and an auxiliary open device having substantially identical device structures, it is routinely possible to achieve two devices with substantially identical parasitic impedances. For a load device and an auxiliary open device each having a different device structure the same goal can be reached by designing the device structure of one device, e.g., the auxiliary open device in such a way that it has a parasitic impedance similar to that of the other device, e.g., the load device. This design, however, requires a detailed knowledge of the parasitic impedances, which can be obtained only from complicated and potentially inaccurate modeling.

When using a load device and an auxiliary open device with substantially identical device structures, the difference in the parasitic impedances is determined by the third body of the load device, which is absent in the auxiliary open device. The third body induces mainly a parasitic capacitance, which adds to the capacitance of the first body and the second body. Since the third body electrically connects the first body and the second body, there will be a continuous voltage drop along the current path from the beginning of the first body via the third body to the end of the second body. As a consequence of the voltage drop the effective capacitance is not identical to the geometrical capacitance, but it will be a function of the surfaces of the first body, the second body and the third body, and of the voltage drop. The effective capacitance is approximately equal to the capacitance of the auxiliary open device if the first surface area is similar to the third surface area. Preferably, the ratio of the two surface areas is between 0.5 and 2 times.

It is advantageous if the first body, the second body and the third body of the load device are integral parts of a resistor element. In this case, there are hardly any unknown parasitic impedances due to the connection between the first body and the third body, and due to the connection between the second body and the third body.

It is advantageous if the first body, the second body, and the third body of the load device comprise polycrystalline silicon. The load device is then manufactured in standard silicon technology.

It is advantageous if the set further comprises an auxiliary short device, which comprises an auxiliary short device structure substantially identical to the load device structure, and a fourth body having a fourth surface area and electrically connecting the first body and the second body; the third surface area being substantially identical to the fourth surface area, the third body having a load resistivity, the fourth body having an auxiliary short resistivity, which is substantially smaller than the load resistivity.

By using a load device and an auxiliary short device, which have substantially identical device structures and which have third bodies with substantially identical surface areas, it is routinely possible to achieve that these devices have substantially identical parasitic impedances. For a load device and an auxiliary short device not fulfilling this condition, the same goal can be reached by designing the device structures of one device, e.g., the auxiliary short device in such a way that it has a parasitic impedance similar to that of the other device, e.g., the load device. This designing, however, requires a detailed knowledge of the parasitic impedances, which can be obtained only from complicated and potentially inaccurate modeling.

It is advantageous if the third body of the auxiliary short device comprises a material selected from titanium silicide and cobalt silicide because the auxiliary short device can be manufactured in standard silicon technology. In particular, it is possible to change the resistivity of the third body of the auxiliary short device without changing the resistivity of the third body of the load device when appropriately chosen masks in the silicon process are chosen.

BRIEF DESCRIPTION OF THE DRAWINGS

These and other aspects of the method for calibrating an N terminal microwave measurement network, the method for microwave characterization of a device under test, and the set of devices for microwave characterization of a device under test will be further elucidated and described with reference to the drawings, in which:

FIGS. 2A–2E are schematic views of devices the set of according to the invention.

The Figures are not drawn to scale. In the Figures, like reference numerals generally refer to like parts.

DETAILED DESCRIPTION OF THE PREFERRED EMBODIMENTS

Figure 1:
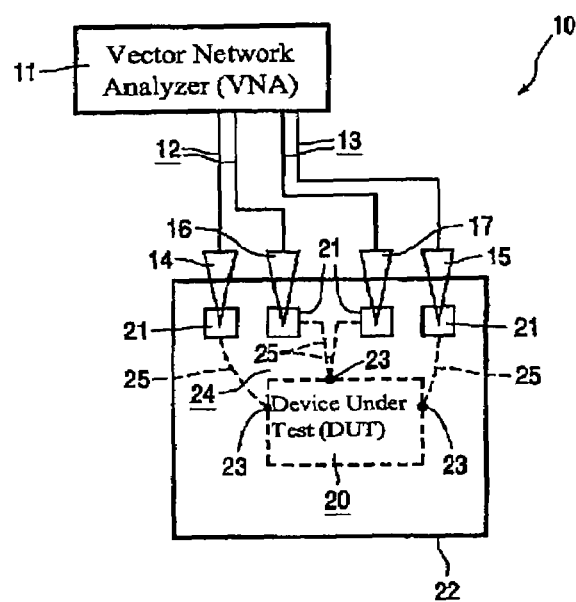
FIG. 1 is a schematic view of an N terminal microwave measurement network according to the prior art.

The N terminal microwave measurement network 10 of the prior art is shown in FIG. 1 for the special case of N=3. The invention, however, is not limited to N=3, which is chosen here for the purpose of explanation only. The N terminal microwave measurement network 10 comprises a vector network analyzer (VNA) 11, which measures network parameter values of a device under test (DUT) 20. The DUT 20 can be, e.g., a transistor or an inductance embedded in a semiconductor article of manufacture 22.

A VNA comprises at least an input probe 12 and an output probe 13, each probe having at least one signal lead 14 and 15, respectively. Here each of the two probes also has a ground lead 16 and 17, respectively, which will be short-circuited via the devices to be measured. Therefore, the ground is treated as one terminal although it is contacted by both probes. The probes 12 and 13 are brought into contact with bond pads 21, which are at the surface of the semiconductor article of manufacture 22 and which are electrically connected to the N=3 terminals 23 of the DUT 20 by means of a DUT embedding structure 24. The DUT embedding structure 24 comprises interconnects 25, and dielectrics for mutually insulating the interconnects 25 and the substrate.

The VNA 11 generates a microwave test signal, which is directed to the input probe 12. It measures the amplitude and phase of the signal reflected back into the input probe 12 and the amplitude and phase of the signal transmitted to the output probe 13 as function of, e.g.,the frequency of the microwave test signal. The transmitted and the reflected signal can be used to first determine the measured DUT network parameter values $Y_{M,DUT}$ of the DUT 20, which then can be used to determine the device specific microwave characteristics $Y_{DUT}$ of the DUT 20. In general, the measured DUT network parameter values $Y_{M,DUT}$ is not identical to the device specific microwave characteristics $Y_{DUT}$ of the DUT 20 because of parasitic impedances due to, e.g., the DUT embedding structure 24 and other contributions discussed above.

The method for calibrating the microwave measurement network 10 according to the invention comprises the following measurement steps, which are performed at least for one frequency of the microwave test signal: A step of measuring open network parameter values $Y_{M,O}$ of an open device 41, a step of measuring short network parameter values $Y_{M,S}$ of a short device 42, a step of measuring load network parameter values $Y_{M,L}$ of a load device 43 and a step of measuring auxiliary open network parameter values $Y_{M,AO}$ of an auxiliary open device 44. Optionally, a step of measuring auxiliary short network parameter values $Y_{M,AS}$ of an auxiliary short device 45 may be added in order to achieve a higher accuracy. Finally, a step of processing the measured network parameters follows to calibrate the network parameter values as will be discussed below.

The open device 41, the short device 42, the load device 43, the auxiliary open device 44, and the auxiliary short device 45 are schematically shown in FIGS. 2A–2E. When these devices are used for the method for calibrating the microwave measurement network 10, each device is embedded in a similar way as the DUT 20, shown in FIG. 1.

The embedding structures then each comprise four bond pads 21, which are electrically connected to the N=3 terminals; the signal lead 14 of the input probe 12 and the signal lead 15 of the output probe 13 are each to be connected to one of the terminals while the ground leads 16 and 17 share one of the terminals, as is shown in FIG. 1.

Figure 2A:
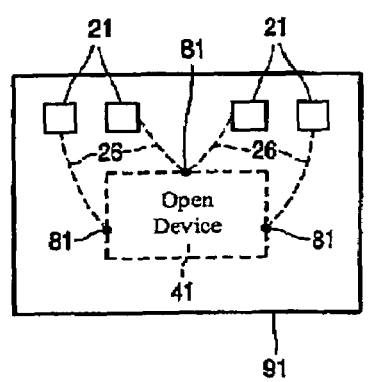

The N=3 terminals 81 of the open device 41, shown in FIG. 2A, are mutually electrically insulated. This can be readily achieved by terminating the interconnects 25 at the terminals 81 of the device and filling the device with an insulator such as a dielectric.

Figure 2B:
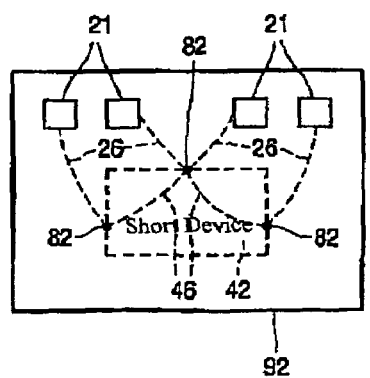

The N=3 terminals 82 of the short device 42, shown in FIG. 2B, are mutually electrically connected by a conductor 46, e.g., a metal in such a way that the DC resistance between any two terminals 82, the short device DC resistance, is as small as possible. Preferably, the short device DC resistance is smaller than 5 Ohm.

The N=3 terminals 83 of the load device 43, shown in FIG. 2C, are mutually electrically connected by resistors 47 in such a way that the input signal lead 15 has a load device DC resistance R to ground, which is larger than the short device DC resistance. Good results were obtained for a load device DC resistance R of 50 Ohm. Preferably, the output signal lead 16 has a designed DC resistance to ground, which is substantially identical to R. The load device 43 has a parasitic load impedance due to, e.g., the shape and position of the resistors 47. This parasitic load impedance, which is generally unknown a priori, deteriorates the accuracy of the calibration step. It can be at least approximately determined by means of the auxiliary open device 44.

The N=3 terminals 84 of the auxiliary open device 44, shown in FIG. 2D, are mutually electrically insulated, but the auxiliary open device 44 has a parasitic auxiliary open impedance, which is substantially identical to the parasitic load impedance. This can be achieved, e.g., by designing an auxiliary open device 44 comprising at least one conductor 48, which is electrically connected to one of the terminals and electrically insulated from the other terminals 84 as will be discussed below.

The N=3 terminals 85 of the auxiliary short device 45, shown in FIG. 2E, are mutually electrically connected, each connection having a DC resistance as small as possible. Good results were obtained for a DC resistance smaller than 5 Ohm. The auxiliary short device has a parasitic auxiliary short impedance, which is substantially identical to the parasitic load impedance. This can be achieved, e.g., by designing an auxiliary open device 45 comprising a conductor 49, which has the same shape and position as resistor 47, but a lower resistivity as will be discussed in detail below.

The open device 41 is embedded in semiconductor article of manufacture 91, the short device 42 is embedded in semiconductor article of manufacture 92, the load device 43 is embedded in semiconductor article of manufacture 93, the auxiliary open device 44 is embedded in semiconductor article of manufacture 94, and the auxiliary short device 45, if used, is embedded in semiconductor article of manufacture 95.

However, the open device 41, the short device 42, the load device 43, the auxiliary open device 44, and the auxiliary short device 45, if used, can alternatively be integrated in the same body, e.g., in semiconductor article of manufacture 22 or a glass substrate. Alternatively it is possible to use several bodies, each body containing at least one of these devices.

The method for de-embedding a device under test 20 is largely similar to the method for calibrating the microwave measurement network 10. However, it differs from the method for calibrating the microwave measurement network 10 in two aspects:

the method for de-embedding a device under test 20 comprises an additional step of measuring DUT network parameter values $Y_{M,DUT}$ of the device under test 20 embedded in a semiconductor article of manufacture 22 by a DUT embedding structure 24; and for the method for de-embedding a device under test 20, the open device 41, the short device 42, the load device 43, the auxiliary open device 44, and the auxiliary short device 45, if used, are each embedded in a semiconductor article of manufacture 22 by an embedding structure, which is substantially identical to the DUT embedding structure 24.

The set of devices comprising the device under test 20, the open device 41, the short device 42, the load device 43, the auxiliary open device 44 and the auxiliary short device 45 can be produced conveniently in silicon technology. By using similar interconnects 25, dielectrics and substrates it can be achieved that the devices of the set each have an embedding structure, which is substantially identical to the DUT embedding structure 24.

The method for calibrating the microwave measurement network 10 and the method for de-embedding a device under test 20 can provide microwave characteristics of the DUT 20 with an improved accuracy because the measured auxiliary open network parameter values $Y_{M,AO}$ and, if measured, the measured auxiliary short network parameter values $Y_{M,AS}$ can be used to approximately determine the parasitic load impedance. One possible way to carry out this procedure will be discussed for the method for de-embedding a device under test 20. The application to the method for calibrating the microwave measurement network 10 is straightforward.

Figure 3A:
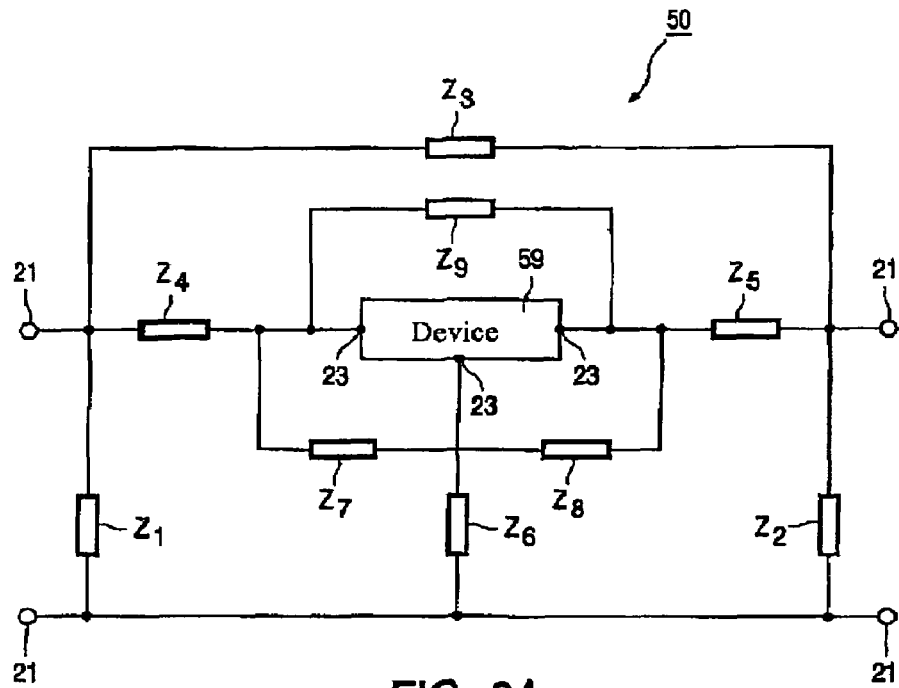
FIG. 3A and FIG. 3B show lumped networks for modeling the parasitic impedances of the devices.

In order to determine the parasitic load impedance the measured load network parameter values $Y_{M,L}$ are modeled by a load network 50, schematically shown in FIG. 3A. The load network 50 comprises a first impedance set $Y_E$, which is formed by $Z_1$, $Z_2$ and $Z_3$ and which is independent from the load device. The other impedances shown in FIG. 3A, $Z_4$–$Z_9$, depend on both the embedding structure and the load parasitic impedance. Here, the Y-matrix of the device 59, $Y_D$, is the Y-matrix of the load device, $Y_L$, which is equal to a 2×2 unity matrix E multiplied by $y_L=1/R$.

In a network as shown in FIG. 3A the Y-parameters $Y_M$ measured at the bond pads 21 are related to the Y-parameters of the device $Y_D$ via:

$$(Y_M - Y_E)^{-1} = Z_T + (Y_D + Y_I)^{-1} \quad (1)$$

where $Y_E$, $Z_T$ and $Y_I$ are defined by:

$$Y_E = \begin{pmatrix} Z_1^{-1} + Z_3^{-1} & -Z_3^{-1} \\ -Z_3^{-1} & Z_2^{-1} + Z_3^{-1} \end{pmatrix} \quad (2)$$

$$Z_T = \begin{pmatrix} Z_4 + Z_6 & Z_6 \\ Z_6 & Z_5 + Z_6 \end{pmatrix} \quad (3)$$

$$Y_I = \begin{pmatrix} Z_7^{-1} + Z_9^{-1} & -Z_9^{-1} \\ -Z_9^{-1} & Z_8^{-1} + Z_9^{-1} \end{pmatrix} \quad (4)$$

The measured auxiliary open network parameter values $Y_{M,AO}$ are modeled by an auxiliary open network, which is identical to the load network shown in FIG. 3A, except for the Y-matrix $Y_D$, which is approximately equal to a 2×2 unity matrix E multiplied by $y_{AO} = 0$.

The measured auxiliary short network parameter values $Y_{M,AS}$ are modeled by an auxiliary short network, which is identical to the load network shown in FIG. 3A, except for the Y-matrix $Y_D$, which is equal to a 2×2 unity matrix E multiplied by $y_{AS} = \infty$.

Using the measured Y-parameters $Y_{M,L}$, $Y_{M,AO}$ and $Y_{M,AS}$, and the known Y-matrix $Y_D$ for the load device, the auxiliary open device and the auxiliary short device three linear equations similar to Equation 1 are obtained, which can be solved for $Y_E$, $Z_T$ and $Y_I$:

$$Z_T = (A_2^{-1\,2} A_3 + A_2^{-1} A_1)^{-0.5} \quad (5)$$

$$Y_E = -A_2^{-1} A_3 - Z_r^{-1} \quad (6)$$

$$Y_I = -Z_T A_2^{-1} - Z_t^{-1} \quad (7)$$

where:

$$A_1 = Y_{M,AO} \quad (8)$$

$$A_2 = R(Y_{M,L} - Y_{M,AO})(Y_{M,L} - Y_{M,AS})^{-1} \quad (9)$$

$$A_3 = -A_2 Y_{M,AS} \quad (10)$$

Equation (5) comprises the square root of a complex 2×2 matrix, which has an infinite number of solutions. Using Equation (3) it can be shown that the solution for $Z_T$ satisfying Equation (1) must have $Z_4$, $Z_5$ and $Z_6$ each having non-negative imaginary parts.

The first impedance set $Y_E$, is now determined and can be used in the subsequent calculations. The other impedance sets $Z_T$ and $Y_I$ as determined in equations (5) and (7), respectively, cannot be used for determining the impedance set $Y_{DUT}$ of the DUT because they both comprise contributions due to the parasitic load impedance.

The second impedance set comprising the impedance sets $Z'_T$ and $Y'_I$, which are equivalent to the impedance sets $Z_T$ and $Y_I$, describe the parasitic impedances due to the DUT embedding structure but do not comprise contributions due to the parasitic load impedance. The impedance sets $Z'_T$ and $Y'_I$, can be obtained by modeling the measured open network parameter values $Y_{M,O}$ by an open network and the measured short network parameter values $Y_{M,S}$ by a short network. The open network and the short network are similar to the load network shown in FIG. 3A, except for:

the Y-matrix $Y_D$, which now is approximately equal to a 2×2 unity matrix E multiplied by $y_O = 0$ and $y_S = \infty$ for the open network and the short network, respectively; and the values of the impedances $Z_4$ to $Z_9$, which now do not comprise contributions due to the parasitic load impedance.

The impedance sets $Z'_T$ and $Y'_I$, are given by:

$$Z'_T = (Y_{M,S} - Y_E)^{-1} \quad (11)$$

$$Y'_I = ((Y_{M,O} - Y_E)^{-1} - Z'_T)^{-1} \quad (12)$$

These results can now be used to determine the device specific microwave characteristics $Y_{DUT}$ of the DUT 20 from the measured DUT network parameter values $Y_{M,DUT}$. To this end the measured DUT network parameter values $Y_{M,DUT}$ are modeled by a DUT network similar to the load network shown in FIG. 3A, except for:

the Y-matrix $Y_D$, which now is equal to the device specific microwave characteristics $Y_{DUT}$ of the DUT 20; and the values of the impedances $Z_4$ to $Z_9$, which are equal to the values used for modeling the measured open network parameter values $Y_{M,O}$ and the measured short network parameter values $Y_{M,S}$.

Because all impedances $Z_1$–$Z_9$ are known, the device specific microwave characteristics $Y_{DUT}$ of the DUT 20 can be obtained from the measured DUT network parameter values $Y_{M,DUT}$ via:

$$Y_{DUT} = (((Y_{M,DUT} - Y_E)^{-1} - Z'_T)^{-1} - Y'_I)^{-1} \quad (13)$$

When the method for de-embedding a device under test 20 does not comprise the step 35 of measuring auxiliary short network parameter values $Y_{M,AS}$ of an auxiliary short device 45, this procedure for determining the device specific microwave characteristics $Y_{DUT}$ of the DUT 20 has to be adopted in the following way: instead of the measured auxiliary short network parameter values $Y_{M,AS}$ the measured short network parameter values $Y_{M,S}$ are modeled by an auxiliary short network in the way described above. The value of $Y_E$ obtained in this way is an approximation because it contains spurious contributions of the parasitic load impedance. In some cases, in particular when the parasitic load impedance is mainly determined by the parasitic capacitance, it is advantageous to apply this approximation because it involves one measurement and one device less as compared to the method for de-embedding a device under test 20 described above, which saves measuring time and production costs for the device.

In an alternative embodiment the parasitic load impedance are at least approximately determined by using the measured short network parameter values $Y_{M,S}$ instead of the measured auxiliary short network parameter values $Y_{M,AS}$, and by using the measured open network parameter values $Y_{M,O}$ instead of the measured auxiliary open network parameter values $Y_{M,AO}$. In this case the auxiliary short device and the auxiliary open device are not required for de-embedding, which has the advantage of reducing the number of devices required for de-embedding and thus reducing the costs.

The parasitic load impedance is approximately determined by de-embedding the load device using the measured short network parameter values $Y_{M,S}$ and the measured open network parameter values $Y_{M,O}$. It is assumed that the first impedance set $Y_E$, which is formed by $Z_1$, $Z_2$ and $Z_3$ and which is independent from the load device, is—except for a scaling factor x—identical to the impedance set $Y_I$, which is formed by $Z_7$, $Z_8$ and $Z_9$ and which is depends on both the parasitic load impedance and the embedding structure. To this end in Equation 1 $Y_{M,L}$ is used as $Y_D$ and the following approximations are used for the $Y_E$, $Y_I$ and $Z_S$:

$$Y_E = xY_P \quad (14)$$

$$Y_I = (1-x)Y_P \quad (15)$$

$$Z_T = (Y_{M,S} - xY_P)^{-1} \quad (16)$$

and $$((1-x)Y_P)^{-1} = (Y_{M,O} - xY_P)^{-1} - Z_T \quad (17)$$

By substituting Equation 16 into Equation 17 $Y_P$ is determined for a given parameter x. Using this value of $Y_P$ and x the parameters $Y_E$, $Z_T$ and $Y_I$ are determined. Subsequently $Y_{DUT}$ is determined from Equation 1 using these results and $Y_{M,DUT}$ as $Y_M$.

Figure 5A:
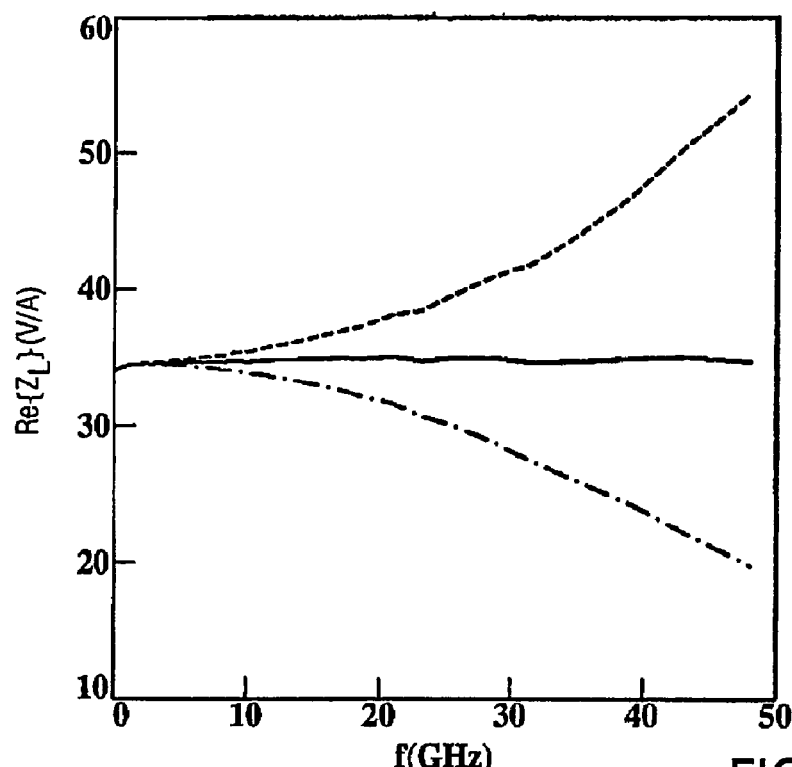
FIG. 5A and FIG. 5B show the series resistance and the induction, respectively, of a load resistor as function of the frequency for different values of the fitting parameter x.
Figure 5B:
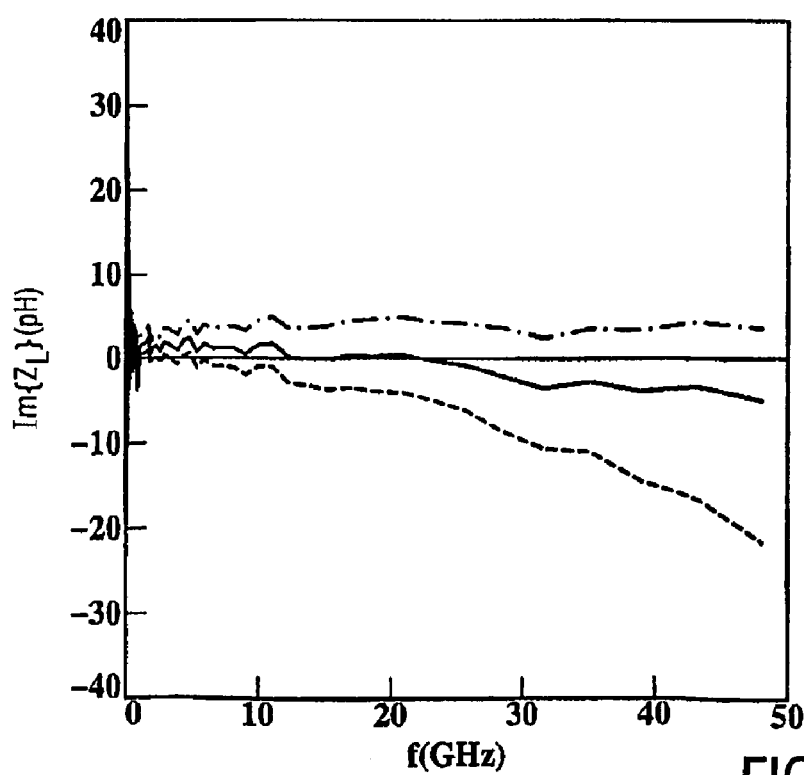
Figure 6A:
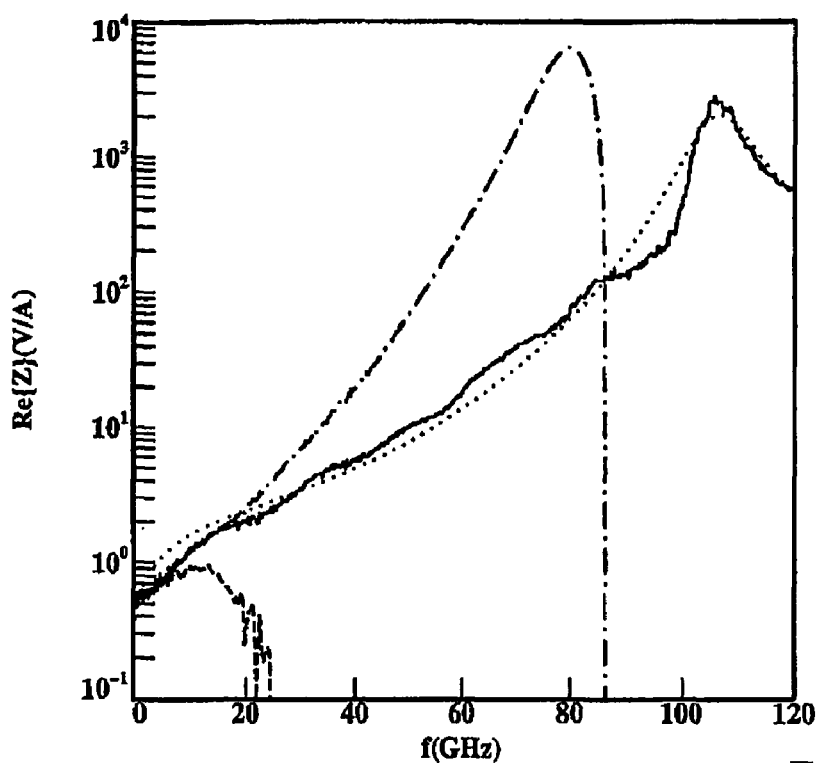
FIG. 6A and FIG. 6B show the series resistance and the induction, respectively, of a coil as function of the frequency for different methods of de-embedding.
Figure 6B:
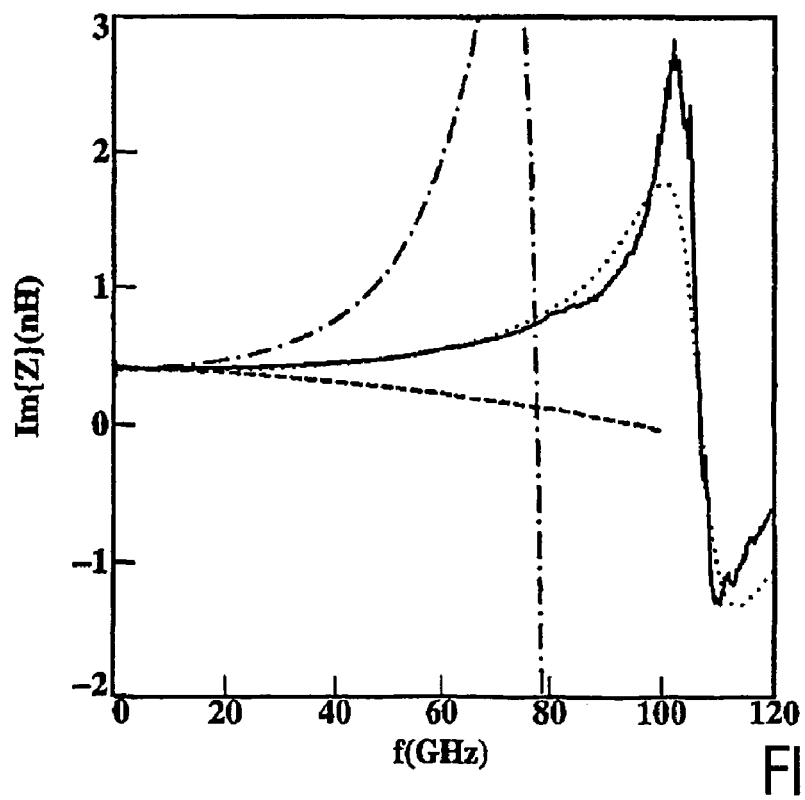

The scaling factor x is determined by fitting the real part of the de-embedded load impedance, Re $\{Z_L\}$, such that its frequency dependence is minimized. In FIGS. 5A and 5B the real and imaginary part of the de-embedded load impedance are shown for x=1 and x=0 by the dashed dotted line and the dashed line, respectively. These two limiting cases, which are often referred to as open-short and short-open de-embedding, result in an unphysical frequency dependence of the real part of the de-embedded load impedance. The best results shown in FIGS. 6A and 6B by a solid line are obtained for x=0.45. The value of x depends on the embedding structure and the structure of the load device used.

Figure 3B:
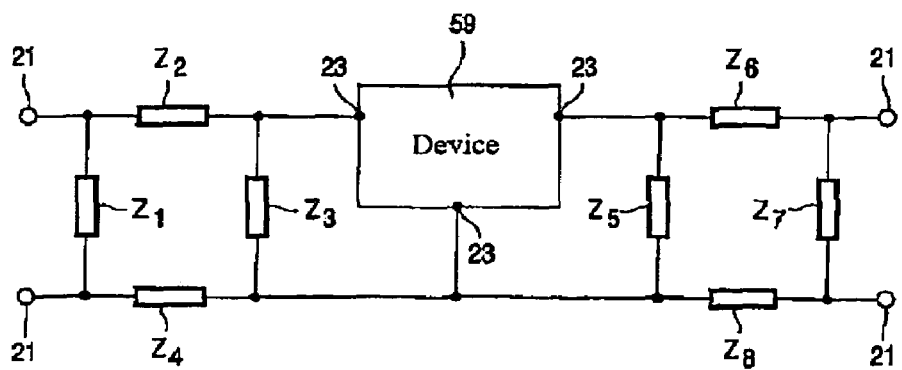

Instead of the lumped network shown in FIG. 3A other lumped networks can be used to model the parasitic impedances. An example of an alternative lumped network is shown in FIG. 3B. This model involves one impedance less as compared to the model of FIG. 3A. In particular, it does not account for a coupling between the input port and the output port, which is parallel to the device. Therefore, the application of the method for de-embedding a device under test 20 involving this model will produce less accurate results, which nevertheless can be useful for approximately accounting for the parasitic load impedance. The extension of the above mathematical treatment to include this model is straightforward.

Figure 4A:
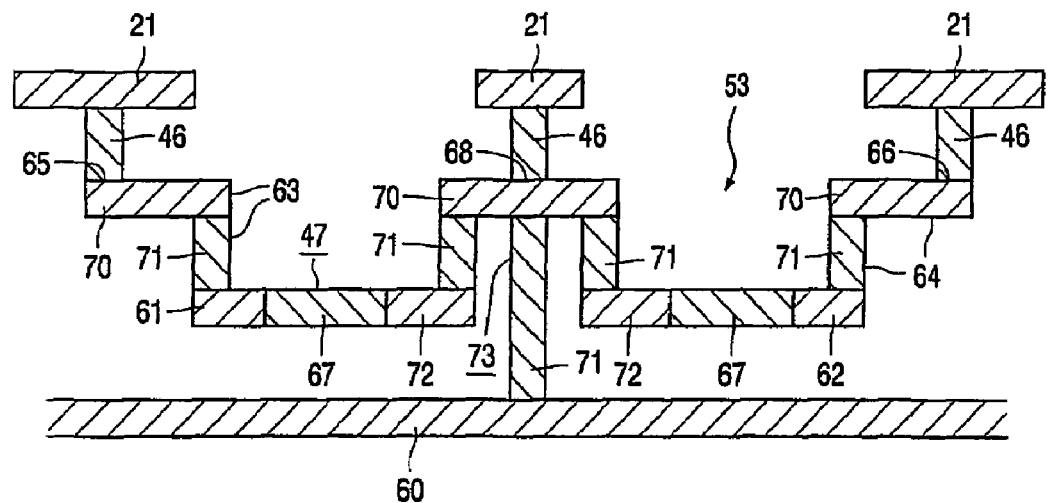
FIG. 4A, FIG. 4B and FIG. 4C show an embodiment of the load device, the auxiliary open device and the auxiliary short device of a set of devices according to the invention.
Figure 4B:
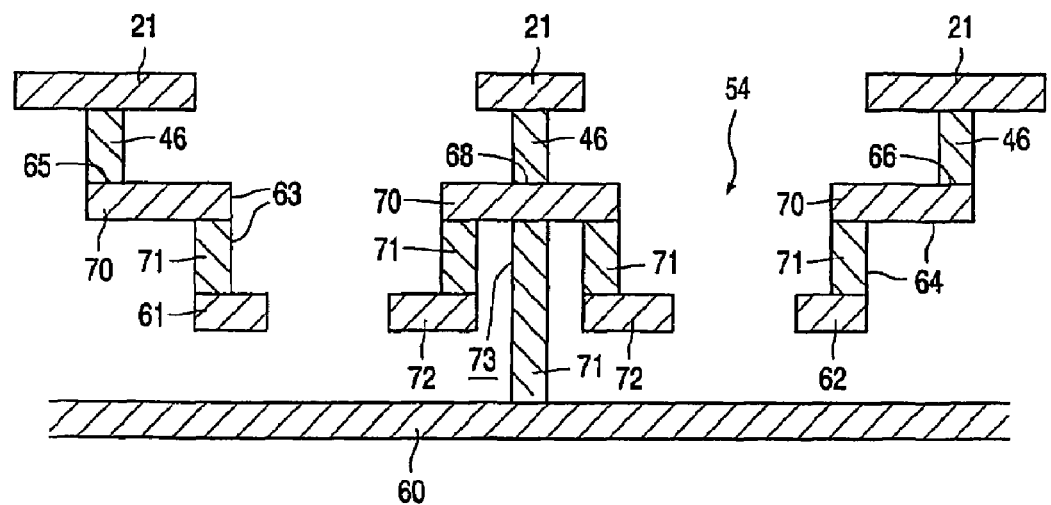
Figure 4C:
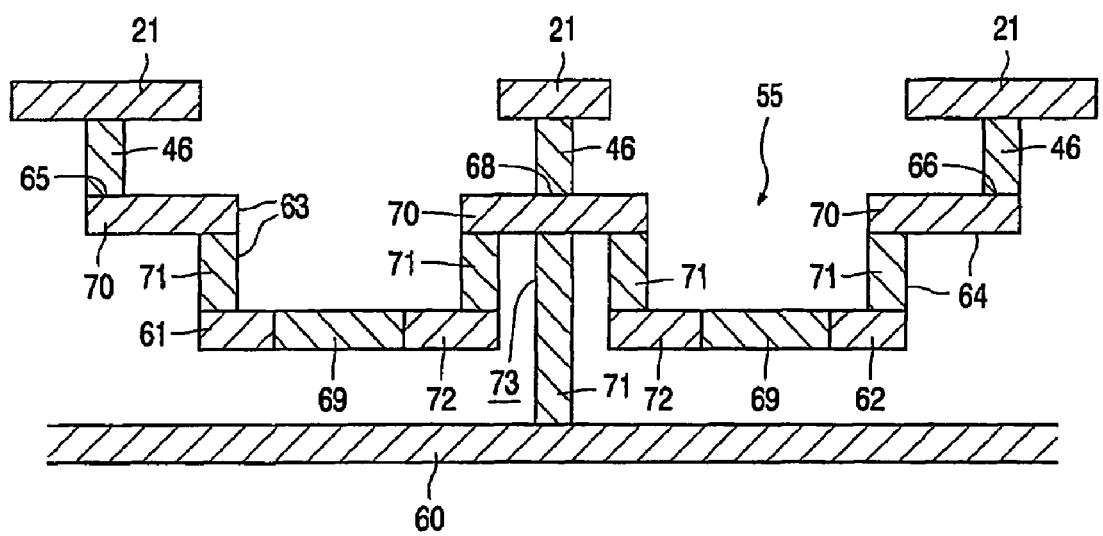

According to the invention the load device 43, the auxiliary open device 44 and the auxiliary short device 45 have substantially identical parasitic impedances. One embodiment of devices with this property is shown in FIG. 4A, FIG. 4B and FIG. 4C, respectively. The load device 43, the auxiliary open device 44 and the auxiliary short device 45 comprise a load device structure 53, an auxiliary open device structure 54, and an auxiliary short device structure 55, respectively. These three device structures are substantially identical to each other.

The load device structure 53 comprises a substrate 60, which comprises a ground terminal 68. Terminal 68 is electrically connected via interconnect 46 to one of the bond pads 21, which is to be contacted with the ground leads 16 and 17. The substrate 60 comprises a material selected from metals and semiconductors, e.g., silicon.

The load device structure 53 further comprises a first body 61 having a first surface area and a second body 62. A first lead 63 is formed by a horizontal metal layer 70 and at least one via 71, which is a vertical electrical connector. The first lead 63 electrically connects a first terminal 65 and the first body 61. A second lead 64, formed by a metal layer 70 and at least one via 71, electrically connects a second terminal 66 and the second body 62.

Preferably, the via 71 comprises more than one via to reduce the ohmic resistance of the via. For convenience during manufacturing and for symmetric device properties, the first body 61 and the second body 62 have the same thickness and the same distance to the substrate 60.

The load device structure 53 further comprises a ground connection structure 73, which is formed by a metal layer 70, a via 71 electrically connecting the substrate 60 and the metal layer 70, and auxiliary bodies 72.

The load device structure 53 further comprises a third body 67 having a third surface area and electrically connecting the first body 61 and the second body 62. The auxiliary open device structure 54, shown in FIG. 4B, in which the first terminal 65 and the second terminal 66 are electrically insulated, does not comprise the third body 67. Preferably, the first surface area of the load device 43 is between 0.5 and 2 times the third surface area of the load device 43. This condition implies that the capacitive coupling of the conductor formed by the first body 61, the second body 62 and the third body 67 of the load device 43 is similar to the capacitive coupling of the first body 61 and the second body 62 of the auxiliary open device 43.

In the embodiment of FIG. 4A the first body 61, the second body 62 and the third body 67 of the load device 43 are integral parts of a resistor 47. Preferably the first body 61 and the second body 62 comprise a material selected from metal silicides. Good results were obtained with PtSi, $Pd_2Si$, $CoSi_2$ and $NiSi_2$. Preferably the third body 67 comprises polycrystalline silicon because this material has a well-defined resistivity, which can be modified as will be discussed below. The auxiliary open device of FIG. 4B can be readily obtained in the same process: After resistor 47 is deposited the third body 67 can be removed by using a lithography step, which defines an opening of the width of the third body 67, followed by an etching step, which removes the third body 67, yielding the structure of FIG. 4B.

The auxiliary short device, shown in FIG. 4C, comprises a fourth body 69, which electrically connects the first body 61 and the second body 62. The fourth body 69 of the auxiliary short device 45 has a surface area substantially identical to the surface area of the third body 67 of the load device 43. The third body 67 has a resistivity, which is substantially larger than the resistivity of the fourth body 69. This property can be obtained, e.g., in a similar way as obtaining the load device 43 and the auxiliary open device 44: After resistor 47 is deposited the third body 67 can be selectively chemically modified by using a lithography step, which defines an opening of the width of the third body 67, followed by depositing a material selected from titanium and cobalt and forming a low resistivity film with the polycrystalline silicon, yielding the structure of FIG. 4C.

The real part Re$\{Z\}$ and the imaginary part Im$\{Z\}$ of the complex inductance Z of a single loop coil with an inductance of 0.4 nH and a resonance frequency of 100 GHz are shown in FIGS. 5A and 5B as function of the frequency, respectively. The real part Re$\{Z\}$ and the imaginary part Im$\{Z\}$ correspond to the series resistance and the inductance, respectively. The dashed line shows the result obtained by de-embedding according to the known method whereas the dotted line shows the result obtained by fitting an equivalent circuit model. It is evident from FIGS. 6A and 6B that the known method is not reliable for frequencies higher than 10 GHz.

The result obtained by de-embedding according to the invention using the open device, the short device, the load device and the auxiliary open device follow the theoretically predicted behavior shown by the dotted line much better.

When analyzing these results the inventors gained the insight that the parasitic impedance of the open device have to be taken into account as well in order to obtain an even better result. The solid line in FIGS. 5A and 5B shows the result obtained by de-embedding according to the invention using the open device, the short device, the load device and the auxiliary open device taking into account an parasitic capacitance of 2.5 fF and a parasitic series resistance of 700 V/A for the open device. This result reproduces the shape of the theoretically expected behavior shown by the dotted line very well.

The result obtained by de-embedding according to the invention using the open device, the short device and the load device only, i.e. approximately determining the parasitic load impedance by fitting the parameter x, is similar to the result obtained by using the auxiliary open device for do-embedding as well.

The accuracy of a method for calibrating an N terminal microwave measurement network 10, comprising the measurement of network parameter values of a load device 43, depends on the knowledge of the parasitic impedance of the load device 43. Measuring network parameter values of an auxiliary open device 44, having substantially identical parasitic impedance as compared to the load device 43, allows one to at least approximately determine the parasitic impedances of the load device 43. The accuracy can be further increased by measuring network parameter values of an auxiliary short device 45, having substantially identical parasitic impedance as compared to the load device 43. A similar principle can be used for de-embedding a device under test. A load device 43, an auxiliary open device 44 and an auxiliary short device 45 having substantially identical parasitic impedances are disclosed.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of other elements or steps than those listed in a claim. The word "a" or "an" preceding an element does not exclude the presence of a plurality of such elements. In the claims, the scope of the step of determining the parasitic load impedance includes both determining an approximation of the parasitic load impedance and precisely determining the exact value of the parasitic load impedance.

The invention claimed is:

1. A method for de-embedding a device under test having N terminals, N being an integer larger than one, the device under test having device specific microwave characteristics and being embedded in a semiconductor article of manufacture by a DUT embedding structure, the semiconductor article of manufacture being embedded in a measurement network, the method comprising the steps of:
   measuring DUT network parameter values of the device under test;
   measuring open network parameter values of an open device having N terminals, which are mutually electrically insulated, the open device being embedded in a semiconductor article of manufacture by an embedding structure, which is substantially identical to the DUT embedding structure;
   measuring short network parameter values of a short device having N terminals, which are mutually electrically connected by conductors, each conductor having a short device DC resistance, the short device being embedded in a semiconductor article of manufacture by an embedding structure, which is substantially identical to the DUT embedding structure;
   measuring load network parameter values of a load device having N terminals, which are mutually electrically connected by resistors, each resistor having a load device DC resistance, which is larger than the short device DC resistance, the load device being embedded in a semiconductor article of manufacture by an embedding structure, which is substantially identical to the DUT embedding structure, the load device having a parasitic load impedance, and
   determining the device specific microwave characteristics, in that the method further comprises the step of determining the parasitic load impedance prior to the step of determining the device specific microwave characteristics.

2. A method as claimed in claim 1, characterized in that the step of determining the parasitic load impedance comprises the sub-step of measuring auxiliary open network parameter values of an auxiliary open device having N terminals, which are mutually electrically insulated, the auxiliary open device having a parasitic auxiliary open impedance, which is substantially identical to the parasitic load impedance, the auxiliary open device being embedded in a semiconductor article of manufacture by an embedding structure, which is substantially identical to the DUT embedding structure.

3. A method as claimed in claim 2 wherein:
   the measured load network parameter values are modeled by a load network comprising a first impedance set being independent from the load device;
   the measured auxiliary open network parameter values are modeled by an auxiliary open network comprising the first impedance set;
   the measured short network parameter values are modeled by an auxiliary short network comprising the first impedance set;
   the first impedance set is determined from the load network, the auxiliary open network, and the auxiliary short network;
   the measured open network parameter values are modeled by an open network comprising the first impedance set and a second impedance set;
   the measured short network parameter values are modeled by a short network comprising the first impedance set and the second impedance set;
   the second impedance set is determined from the open network, the short network, and the first impedance set;
   the measured DUT network parameter values are modeled by a DUT network comprising the first impedance set, the second impedance set and a DUT impedance set; and
   the DUT impedance set is determined from the DUT network, the first impedance set, and the second impedance set.

4. A method as claimed in claim 2 characterized in that the step of determining the parasitic load impedance further comprises the sub-step of measuring auxiliary short network parameter values of an auxiliary short device having N terminals, which are mutually electrically connected by conductors, each conductor having an auxiliary short device DC resistance, which is smaller than the load device DC resistance, the auxiliary short device having a parasitic auxiliary short impedance, which is substantially identical to the parasitic load impedance, the auxiliary short device being embedded in a semiconductor article of manufacture by an embedding structure, which is substantially identical to the DOT embedding structure.

5. A method as claimed in claim 4 wherein:
the measured load network parameter values are modeled by a load network comprising a first impedance set being independent from the load device;
the measured auxiliary open network parameter values are modeled by an auxiliary open network comprising the first impedance set;
the measured auxiliary short network parameter values are modeled by an auxiliary short network comprising the first impedance set;
the first impedance set is determined from the load network, the auxiliary open network, and the auxiliary short network;
the measured open network parameter values are modeled by an open network comprising the first impedance set and a second impedance set;
the measured short network parameter values are modeled by a shaft network comprising the first impedance set and the second impedance set;
the second impedance set is determined from the open network, the short network, and the first impedance set;
the measured DUT network parameter values are modeled by a DUT network comprising the first impedance set, the second impedance set and a DUT impedance set; and
the DUT impedance set is determined from the DUT network, the first impedance set, and the second impedance set.

6. A method as claimed in claim 1 characterized in that the step of determining the parasitic load impedance from the measured short network parameter values and the measured open network parameter value.

7. A set of devices for de-embedding a device under test having N terminals, N being an integer larger than one, the device under test being embedded in a semiconductor article of manufacture by a DUT embedding structure, the set comprising:
the device under test;
an open device having N terminals, which are mutually electrically insulated, the open device being embedded in a semiconductor article of manufacture by an embedding structure, which is substantially identical to the DUT embedding structure;
a short device having N terminals, which are mutually electrically connected by conductors, each conductor having a short device DC resistance, the short device being embedded in a semiconductor article of manufacture by an embedding structure, which is substantially identical to the DUT embedding structure; and
a load device having N terminals, which are mutually electrically connected by resistors, each resistor having a load device DC resistance, which is larger than the short device DC resistance, the load device being embedded in a semiconductor article of manufacture by an embedding structure, which is substantially identical to the DUT embedding structure, the load device having a parasitic load impedance, whereby further comprising an auxiliary open device having N terminals, which are mutually electrically insulated, the auxiliary open device having a parasitic auxiliary open impedance, which is substantially identical to the parasitic load impedance, the auxiliary open device being embedded in a semiconductor article of manufacture by an embedding structure, which is substantially identical to the DUT embedding structure.

8. A set of devices as claimed in claim 7 further comprising an auxiliary short device having N terminals, which are mutually electrically connected by conductors, each conductor having an auxiliary short device DC resistance, which is smaller than the load device DC resistance, the auxiliary short device having a parasitic auxiliary short impedance, which is substantially identical to the parasitic load impedance, the auxiliary short device being embedded in a semiconductor article of manufacture by an embedding structure, which is substantially identical to the DUT embedding structure.

9. A set of devices as claimed in claim 9 wherein:
the load device comprises a load device structure;
the auxiliary open device comprises an auxiliary open device structure, which is substantially identical to the load device structure, the load device structure comprising:
a first body having a first surface area, a first lead electrically connecting a first terminal and the first body;
a second body, a second lead electrically connecting a second terminal and the second body;
the load device further comprises a third body having a third surface area and electrically connecting the first body and the second body.

10. A set of devices as claimed in claim 9 wherein the first body, the second body and the third body of the load device are integral parts of a resistor.

11. A set of devices as claimed in claim 9 wherein the first body, the second body, and the third body of the load device comprise polycrystalline silicon.

12. A set of devices as claimed in claim 9 further comprising an auxiliary short device, which comprises:
an auxiliary short device structure substantially identical to the load device structure and
a fourth body having a fourth surface area and electrically connecting the first body and the second body; the third surface area being substantially identical to the fourth surface area;
the third body having a load resistivity, the fourth body having an auxiliary short resistivity, which is substantially smaller than the load resistivity.

13. A set of devices as claimed in claim 12 wherein the fourth body comprises a material selected from titanium silicide and cobalt silicide.

14. A vector network analyzer for generating a microwave test signal at an input probe, for measuring a signal reflected back into the input probe and a signal transmitted to an output probe, and for determining device specific microwave characteristics said vector network analyzer is configured to perform:
measuring DUT network parameter values of the device under test;
measuring open network parameter values of an open device having N terminals, which are mutually electrically insulated, the open device being embedded in a semiconductor article of manufacture by an embedding structure, which is substantially identical to the DUT embedding structure;
measuring short network parameter values of a short device having N terminals, which are mutually electrically connected by conductors, each conductor having a short device DC resistance, the short device being embedded in a semiconductor article of manufacture by an embedding structure which is substantially identical to the DUT embedding structure;

measuring load network parameter values of a load device having N terminals, which are mutually electrically connected by resistors, each resistor having a load device DC resistance, which is larger than the short device DC resistance, the load device being embedded in a semiconductor article of manufacture by an embedding structure, which is substantially identical to the DUT embedding structure, the load device having a parasitic load impedance, and determining the device specific microwave characteristics, wherein further comprising determining the parasitic load impedance prior to determining the device specific microwave characteristics.

* * * * *